United States Patent
Takamine

(10) Patent No.: US 11,848,661 B2
(45) Date of Patent: Dec. 19, 2023

(54) FILTER AND MULTIPLEXER

(71) Applicant: Murata Manufacturing Co., Ltd., Nagaokakyo (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 485 days.

(21) Appl. No.: 17/151,884

(22) Filed: Jan. 19, 2021

(65) Prior Publication Data

US 2021/0143791 A1    May 13, 2021

Related U.S. Application Data

(63) Continuation of application No. PCT/JP2019/029734, filed on Jul. 30, 2019.

(30) Foreign Application Priority Data

Aug. 7, 2018  (JP) .................. 2018-148393

(51) Int. Cl.
  *H03H 9/145*  (2006.01)
  *H03H 9/64*  (2006.01)
  (Continued)

(52) U.S. Cl.
  CPC ........ *H03H 9/145* (2013.01); *H03H 9/02637* (2013.01); *H03H 9/02866* (2013.01);
  (Continued)

(58) Field of Classification Search
  CPC ........ H03H 9/145; H03H 9/1457; H03H 9/25; H03H 9/6483
  (Continued)

(56) References Cited

U.S. PATENT DOCUMENTS 7,847,657 B2 *  12/2010  Takahashi ............ H03H 9/0071
                                                   333/195
2002/0175783 A1   11/2002  Watanabe et al.
(Continued)

FOREIGN PATENT DOCUMENTS

JP    2003-008390 A    1/2003
JP    2004-007713 A    1/2004
(Continued)

OTHER PUBLICATIONS

Official Communication issued in International Patent Application No. PCT/JP2019/029734, dated Oct. 15, 2019.

*Primary Examiner* — Rakesh B Patel
(74) *Attorney, Agent, or Firm* — Keating & Bennett, LLP

(57) ABSTRACT

A filter includes an additional circuit including first and second IDT electrode groups connected in multiple stages between first and second input/output terminals, the first IDT electrode group includes first and second IDT electrodes side by side in a propagation direction of an acoustic wave, and the second IDT electrode group includes third and fourth IDT electrodes side by side in the propagation direction. One end of each of the first and second IDT electrodes is respectively connected to the first and second input/output terminals. Other ends of the first and second IDT electrodes are connected in common and to a ground. One ends of the third and fourth IDT electrodes are connected in common. Other ends of the third and fourth IDT electrodes are connected in common. The additional circuit is connected in parallel with at least a portion of a filter circuit.

20 Claims, 7 Drawing Sheets

(51) Int. Cl.
  *H03H 9/02* (2006.01)
  *H03H 9/25* (2006.01)
  *H03H 9/72* (2006.01)

(52) U.S. Cl.
  CPC ............ *H03H 9/25* (2013.01); *H03H 9/6483* (2013.01); *H03H 9/725* (2013.01)

(58) Field of Classification Search
  USPC .......................................................... 333/193
  See application file for complete search history.

(56) References Cited

U.S. PATENT DOCUMENTS

| | | |
|---|---|---|
| 2013/0113576 A1 | 5/2013 | Inoue et al. |
| 2017/0099043 A1 | 4/2017 | Goto et al. |
| 2018/0152191 A1 | 5/2018 | Niwa et al. |

FOREIGN PATENT DOCUMENTS

| | | |
|---|---|---|
| JP | 2013-118611 A | 6/2013 |
| JP | 2016-171446 A | 9/2016 |
| JP | 2017-092945 A | 5/2017 |
| JP | 2018-088678 A | 6/2018 |

\* cited by examiner

FILTER AND MULTIPLEXER

CROSS REFERENCE TO RELATED APPLICATIONS

This application claims the benefit of priority to Japanese Patent Application No. 2018-148393 filed on Aug. 7, 2018 and is a Continuation Application of PCT Application No. PCT/JP2019/029734 filed on Jul. 30, 2019. The entire contents of each application are hereby incorporated herein by reference.

BACKGROUND OF THE INVENTION

1. Field of the Invention

The present invention relates to a filter and a multiplexer including an additional circuit.

2. Description of the Related Art

A technique has been known for improving attenuation characteristics by connecting, in parallel with a filter unit, a cancellation circuit which generates a signal having an opposite phase and similar amplitude to those of an undesired signal component that leaks from the filter unit.

For example, Japanese Unexamined Patent Application Publication No. 2013-118611 discloses a duplexer having a cancellation circuit. The cancellation circuit is provided by using an acoustic wave delay line or a longitudinally coupled acoustic wave resonator including at least two IDTs between an input terminal and an output terminal (see, for example, paragraph 0061, FIGS. 15A to 15E). Japanese Unexamined Patent Application Publication No. 2013-118611 illustrates a longitudinally coupled acoustic wave resonator including two acoustic wave resonators (for example, paragraph 0058, FIG. 15C).

The cancellation circuit in Japanese Unexamined Patent Application Publication No. 2013-118611 corresponds to an additional circuit in the present specification.

However, in a configuration of the related art (for example, Japanese Unexamined Patent Application Publication No. 2013-118611), for each of at least two IDT electrodes of a cancellation circuit (additional circuit), a terminal on a side opposite to a side of a signal terminal is connected to a ground. Thus, there is a problem in that wiring on a piezoelectric substrate becomes complicated and the wiring becomes disadvantageous in size reduction.

SUMMARY OF THE INVENTION

Preferred embodiments of the present invention provide filters and multiplexers each including an additional circuit, that each have good attenuation characteristics and isolation characteristics, and that each enable size reduction.

A filter according to a preferred embodiment of the present invention includes a filter circuit, and an additional circuit connected in parallel with at least a portion of the filter circuit, wherein the additional circuit includes a first IDT electrode group and a second IDT electrode group connected in multiple stages between a first input/output terminal and a second input/output terminal, the first IDT electrode group includes a first IDT electrode and a second IDT electrode that are side by side in a propagation direction of an acoustic wave, the second IDT electrode group includes a third IDT electrode and a fourth IDT electrode that are side by side in a propagation direction of an acoustic wave, one end of the first IDT electrode is connected to the first input/output terminal, one end of the third IDT electrode is connected to the second input/output terminal, the other end of the first IDT electrode and the other end of the third IDT electrode are connected in common and connected to a ground, one end of the second IDT electrode and one end of the fourth IDT electrode are connected in common, and the other end of the second IDT electrode and the other end of the fourth IDT electrode are connected in common.

According to the filter described above, in the additional circuit, the respective one ends, and the respective other ends of the second IDT electrode and the fourth IDT electrode are connected in common. Thus, it is not necessary to connect the second IDT electrode and the fourth IDT electrode to the ground in order to transmit a high-frequency signal between the second IDT electrode and the fourth IDT electrode. In addition, the respective other ends of the first IDT electrode and the second IDT electrode are connected in common and are connected to the ground only at one location. Thus, only one ground is required for the IDT electrode group of the additional circuit.

This simplifies ground wiring, and thus, for example, it is possible to reduce or prevent an increase in area of the additional circuit due to the ground wiring, as compared to an additional circuit including an IDT electrode group in one stage, and all of one ends of respective IDT electrodes are connected to the ground.

Further, according to the above-described additional circuit, the two IDT electrode groups connected in multiple stages are used, and thus, a degree of freedom in phase adjustment is higher, as compared to an additional circuit including an IDT electrode group in one stage, for example. Thus, it is possible to generate a cancellation signal with higher accuracy for a signal component in a wider frequency band, so as to obtain a filter having excellent attenuation characteristics.

In this way, by using the above-described additional circuit, it is possible to obtain filters that each have excellent attenuation characteristics and size reduction.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the drawings. Note that, the preferred embodiments described below represent general or specific examples. Numerical values, shapes, materials, elements, arrangement and connection configurations of the elements, and the like illustrated in the following preferred embodiments are merely examples and are not intended to limit the present invention. Note that, in the following preferred embodiments, the term "connected" includes not only a case of direct connection by a wiring conductor, but also a case of electrical connection through another circuit element.

Preferred Embodiment 1

A multiplexer according to Preferred Embodiment 1 of the present invention will be described by illustrating an example of a duplexer including a transmission filter and a reception filter.

Figure 1:
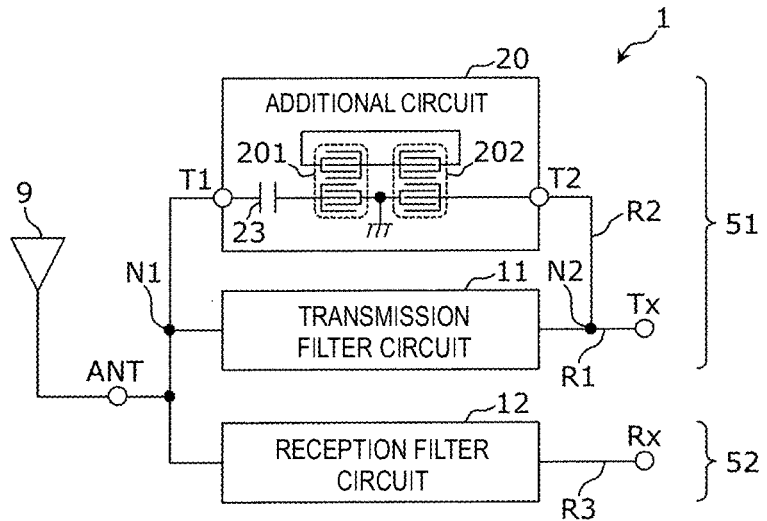
FIG. 1 is a circuit diagram illustrating an example of a configuration of a duplexer according to Preferred Embodiment 1 of the present invention.

FIG. 1 is a circuit diagram illustrating an example of a configuration of the duplexer according to Preferred Embodiment 1. As illustrated in FIG. 1, a duplexer 1 includes terminals ANT, Tx, and Rx, a transmission filter 51, and a reception filter 52. The transmission filter 51 includes a transmission filter circuit 11 and an additional circuit 20 connected in parallel with at least a part of the transmission filter circuit 11, and the reception filter 52 includes a reception filter circuit 12.

The terminals ANT, Tx, and Rx transmit an antenna signal, a transmission signal, and a reception signal, respectively. The terminal ANT is connected to an antenna 9.

One end of the transmission filter circuit 11 is connected to the terminal ANT, the other end thereof is connected to the terminal Tx, and the transmission filter circuit 11 defines a signal path R1 connecting the terminal ANT and the terminal Tx.

One end of the reception filter circuit 12 is connected to the terminal ANT, the other end thereof is connected to the terminal Rx, and the reception filter circuit 12 defines a signal path R3 connecting the terminal ANT and the terminal Rx.

One end of the additional circuit 20 is connected to a node N1 located between the terminal ANT and the transmission filter circuit 11 on the signal path R1, and the other end thereof is connected to a node N2 located between the terminal Tx and the transmission filter circuit 11 on the signal path R1. The additional circuit 20 defines a signal path R2 connecting the node N1 and the node N2.

The additional circuit 20 includes, on the signal path R2, IDT electrode groups 201 and 202 each connected in multiple stages and a capacitive element 23, and generates a cancellation signal for a signal component of a cancellation target outside a pass band of the transmission filter circuit 11.

In the present example, the IDT electrode group is preferably a longitudinally coupled resonator that transmits a signal by utilizing coupling of acoustic waves, but the configuration is not limited to this example and the IDT electrode group may be a transversal filter that transmits a signal by utilizing propagation of acoustic waves. Further, although the additional circuit 20 is connected in parallel with an entirety of the transmission filter circuit 11 in FIG. 1, the configuration is not limited to this example, and it is sufficient that the additional circuit 20 is connected in parallel with at least a portion of the transmission filter circuit 11. In other words, the nodes N1 and N2 may be provided in the transmission filter circuit 11. Input/output terminals of the additional circuit 20 are referred to as terminals T1 and T2.

Figure 2:
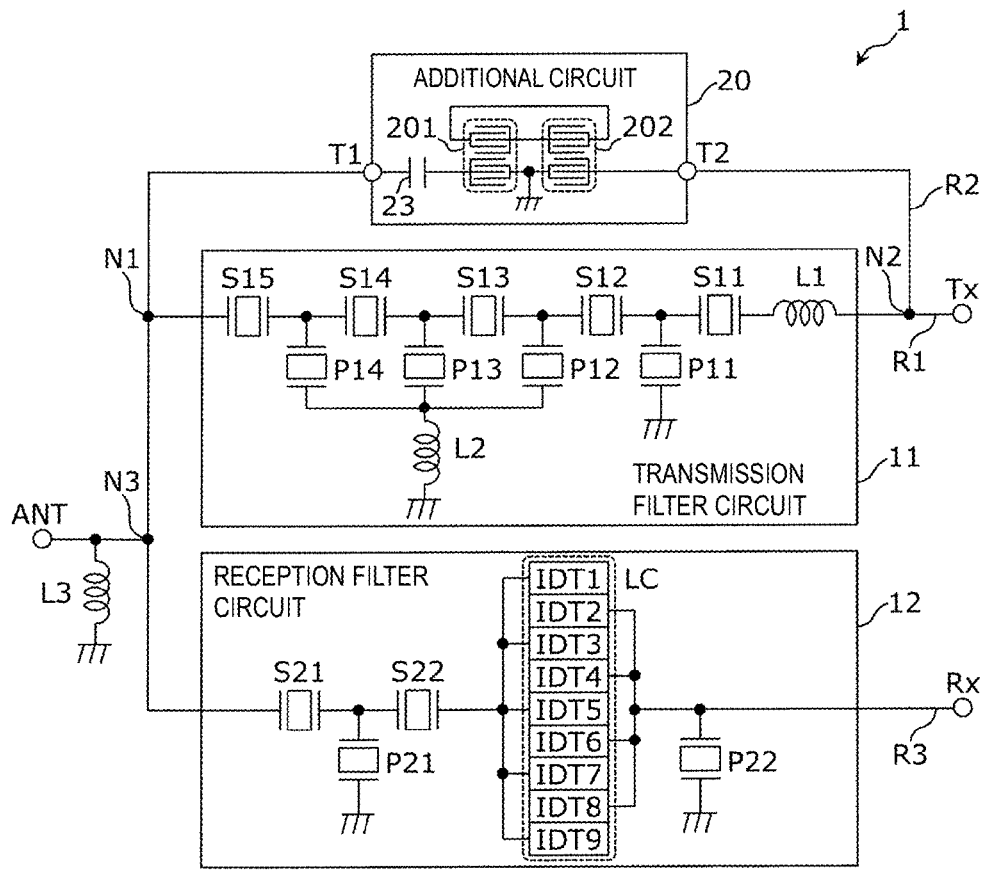
FIG. 2 is a circuit diagram illustrating an example of a detailed configuration of the duplexer according to Preferred Embodiment 1 of the present invention.

FIG. 2 is a circuit diagram illustrating an example of a detailed configuration of the duplexer 1. FIG. 2 illustrates an example of an internal configuration of the transmission filter circuit 11 and the reception filter circuit 12.

The transmission filter circuit 11 is a ladder filter circuit including series resonators S11 to S15 and parallel resonators P11 to P14. The transmission filter circuit 11 includes inductance elements L1 and L2 for matching.

The series resonators S11 to S15 and the inductance element L1 are connected in series and define the signal path R1. The parallel resonators P11 to P14 and the inductance element L2 are connected between the signal path R1 and a ground. The series resonators S11 to S15 and the parallel resonators P11 to P14 are preferably surface acoustic wave resonators, for example.

The reception filter circuit 12 includes a ladder filter circuit including series resonators S21 and S22 and a parallel resonator P21. In a subsequent stage of the ladder filter circuit, a longitudinally coupled resonator LC including resonators IDT1 to IDT9 is connected, and a parallel resonator P22 is further connected.

The series resonators S21 and S22 are connected in series to each other and define the signal path R3 together with the longitudinally coupled resonator LC. The parallel resonators P21 and P22 are connected between the signal path R3 and the ground. The series resonators S21 and S22, the parallel resonators P21 and P22, and the resonators IDT1 to IDT9 are preferably surface acoustic wave resonators, for example.

The signal paths R1 and R3 are connected to each other at the node N3. A path between the node N3 and the terminal ANT is shared by the signal paths R1 and R3. An inductance element L3 providing matching is connected between the path between the node N3 and the terminal ANT and the ground.

According to this configuration, all of the resonators of the transmission filter circuit 11, the reception filter circuit 12, and the additional circuit 20 can be defined by acoustic wave resonators. Accordingly, for example, all of the resonators of the duplexer 1 can be provided on a single piezoelectric substrate to reduce the size of the duplexer 1.

Next, the structure of the IDT electrode groups 201 and 202 of the additional circuit 20 will be described.

Figure 3:
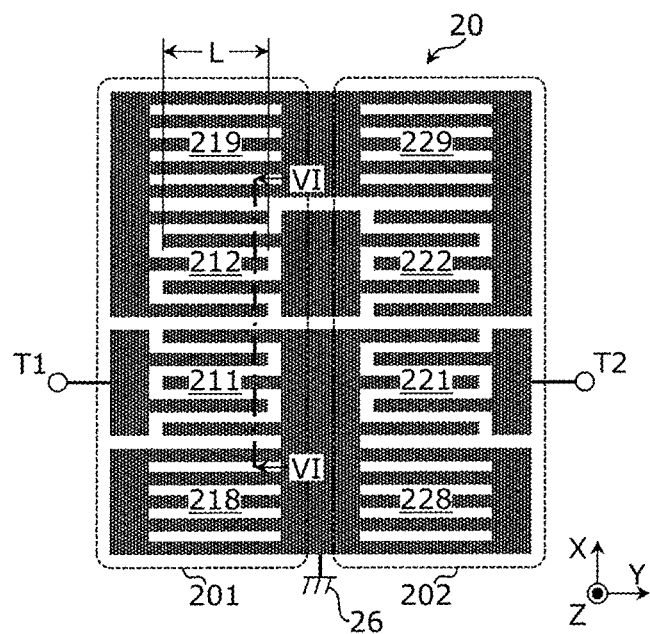
FIG. 3 is a plan view schematically illustrating an example of the structure of an IDT electrode group according to Preferred Embodiment 1 of the present invention.

FIG. 3 is a plan view schematically illustrating the structure of the IDT electrode groups 201 and 202. FIG. 3 schematically illustrates a shape of electrodes in plan view formed on a main surface (XY plane) of a piezoelectric substrate. Each part of the electrodes is referenced by individual name and sign.

The IDT electrode groups 201 and 202 are disposed adjacent to each other in a Y direction. An acoustic wave propagates in an X direction in each of the IDT electrode groups 201 and 202.

The IDT electrode group 201 includes IDT electrodes 211, 212, reflectors 218 and 219. The IDT electrodes 211 and 212 are arranged side by side in the X direction. The reflectors 218 and 219 are disposed adjacent to the IDT electrodes 211 and 212 in the X direction, respectively.

The IDT electrode group 202 includes IDT electrodes 221, 222, and reflectors 228 and 229. The IDT electrodes 221 and 222 are arranged side by side in the X direction. The reflectors 228 and 229 are disposed adjacent to the IDT electrodes 221 and 222 in the X direction, respectively.

Each of the IDT electrodes 211, 212, 221, and 222 includes a pair of comb-shaped electrodes. Each of the comb-shaped electrodes includes a plurality of electrode fingers extending in a direction (Y direction) orthogonal or substantially orthogonal to a propagation direction of an acoustic wave and a busbar electrode connecting one ends of the electrode fingers to each other.

Next, electrical connection between the IDT electrode groups 201 and 202 will be described. Note that, in the following description, one end and the other end of each of the IDT electrodes 211 and 212 mean a busbar electrode disposed on a left side (a negative side in the Y direction) and a busbar electrode disposed on a right side (a positive side in the Y direction) in FIG. 3, respectively. Further, one end and the other end of each of the IDT electrodes 221 and 222 mean a busbar electrode disposed on the right side (the positive side in the Y direction) and a busbar electrode disposed on the left side (the negative side in the Y direction) in FIG. 3, respectively.

The one end of the IDT electrode 211 is connected to the terminal T1, and the one end of the IDT electrode 221 is connected to the terminal T2. The other end of the IDT electrode 211 and the other end of the IDT electrode 221 are connected in common and connected to a ground 26. Note that, in FIG. 3, the capacitive element 23 connected between the one end of the IDT electrode 211 and the terminal T1 is omitted. Hereinafter, to describe a shape of an IDT electrode group in plan view, description of a capacitive element will be omitted as appropriate.

The respective one ends and the respective other ends of the IDT electrode 212 and the IDT electrode 222 are connected in common.

Here, "respective ends of two IDT electrodes are connected in common" means that respective busbar electrodes of the two IDT electrodes are electrically connected to each other so as to be at the same or substantially the same potential. Examples of being connected in common include that respective busbar electrodes of two IDT electrodes are defined by a single electrode, and that respective busbar electrodes of two IDT electrodes are connected to each other by another electrode or a wiring conductor.

In the example in FIG. 3, the other end of the IDT electrode 211 and the other end of the IDT electrode 221 are connected in common by being defined by a single electrode. Further, the one end of the IDT electrode 212 and the one end of the IDT electrode 222 are connected in common by being connected to each other via the reflectors 219 and 229. In addition, the other end of the IDT electrode 212 and the other end of the IDT electrode 222 are connected in common by being defined by a single electrode.

Here, the IDT electrodes 211, 212, 221, and 222 are examples of a first IDT electrode, a second IDT electrode, a third IDT electrode, and a fourth IDT electrode, respectively. Further, the reflectors 219 and 229 are examples of a first reflector and a second reflector, respectively. In addition, the terminals T1 and T2 are examples of a first input/output terminal and a second input/output terminal, respectively.

Next, the cross-sectional structure of the IDT electrode groups 201 and 202 will be described. Note that, the IDT electrode groups 201 and 202 have the same or substantially the same cross-sectional structure, and hereinafter, the cross-sectional structure of the IDT electrode group 201 will be described as an example structure.

Figure 4:
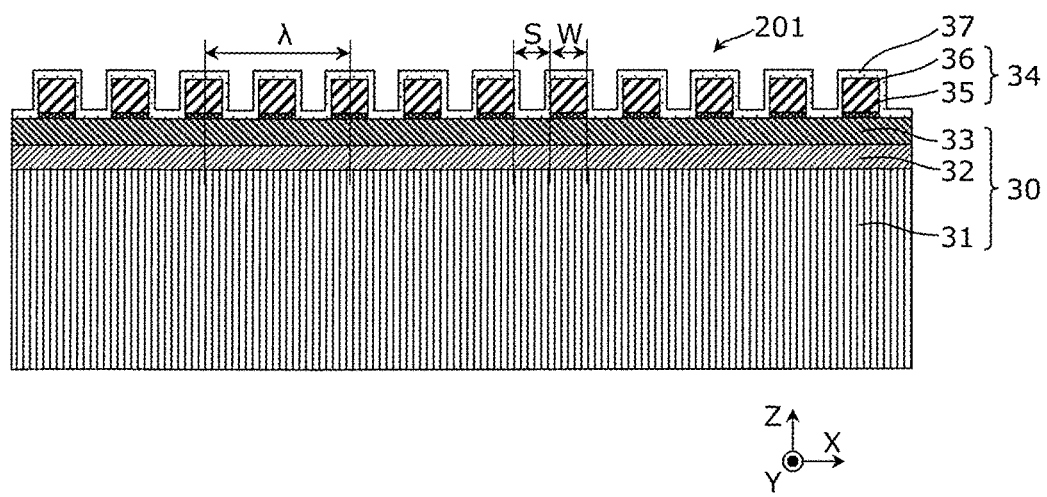
FIG. 4 is a sectional view schematically illustrating an example of the structure of the IDT electrode group according to Preferred Embodiment 1 of the present invention.

FIG. 4 is a sectional view schematically illustrating an example of the structure of the IDT electrode group 201. FIG. 4 illustrates an example of a section of an XZ plane including a line VI-VI in FIG. 3 as viewed in a direction indicated by an arrow. As illustrated in FIG. 4, the IDT electrode group 201 includes a substrate 30, an electrode 34 provided on a main surface of the substrate 30, and a protective layer 37 covering the electrode 34. The IDT electrode group 202 also has the same or substantially the same cross-sectional structure. The electrode 34 corresponds to the IDT electrodes 211, 212, 221, and 222, and the reflectors 218, 219, 228, and 229 in FIG. 3.

The substrate 30 is a multilayer body in which a high acoustic velocity support substrate 31, a low acoustic velocity film 32, and a piezoelectric layer 33 are laminated in this order.

The piezoelectric layer 33 is a piezoelectric film on a main surface of which the electrode 34 is provided. The piezoelectric layer 33 is preferably made of, for example, a 50° Y-cut X-propagation $LiTaO_3$ piezoelectric single crystal or piezoelectric ceramic (lithium tantalate single crystal cut along a plane having a normal line that is an axis rotated by about 50° from a Y-axis with an X-axis being a central axis or ceramic, the single crystal or the ceramic through which a surface acoustic wave propagates in an X-axis direction). A thickness of the piezoelectric layer 33 is preferably, for example, about 600 nm.

The high acoustic velocity support substrate 31 supports the low acoustic velocity film 32, the piezoelectric layer 33, and the electrode 34. The high acoustic velocity support substrate 31 is a substrate in which acoustic velocity of a bulk wave in the high acoustic velocity support substrate 31 is higher than acoustic velocity of an acoustic wave of a surface acoustic wave or a boundary wave propagating through the piezoelectric layer 33, and confines a surface acoustic wave to a portion where the piezoelectric layer 33 and the low acoustic velocity film 32 are laminated, such that the surface acoustic wave does not leak below the high acoustic velocity support substrate 31. The high acoustic velocity support substrate 31 is preferably, for example, a silicon substrate, and preferably has a thickness of, for example, about 200 μm.

The low acoustic velocity film 32 is a film in which acoustic velocity of a bulk wave in the low acoustic velocity film 32 is lower than acoustic velocity of an acoustic wave propagating through the piezoelectric layer 33, and is disposed between the piezoelectric layer 33 and the high acoustic velocity support substrate 31. Due to this structure and a property of energy of an acoustic wave concentrating in a medium having a low acoustic velocity, leakage of acoustic wave energy outside the electrode 34 is reduced or prevented. The low acoustic velocity film 32 preferably, for example, includes silicon dioxide as a main component. A thickness of the low acoustic velocity film 32 is preferably, for example, about 670 nm.

The electrode 34 has structure in which an adhesion layer 35 and a main electrode layer 36 are laminated.

The adhesion layer 35 improves adhesion between the piezoelectric layer 33 and the main electrode layer 36, and preferably, for example, includes titanium as a main component. A film thickness of the adhesion layer 35 is preferably, for example, about 12 nm.

The main electrode layer 36 is preferably made of, for example, aluminum containing 1% of copper. A film thickness of the main electrode layer 36 is preferably, for example, about 132 nm.

The protective layer 37, for example, protects the main electrode layer 36 from an external environment, adjusts frequency-temperature characteristics, and improves moisture resistance, and preferably, for example, includes silicon dioxide as a main component. The protective layer 37 preferably has a film thickness of, for example, about 30 nm.

In FIG. 3 and FIG. 4, some electrode parameters are illustrated. The electrode parameters define the shapes and sizes of the IDT electrode and the reflector. Examples of the electrode parameters include a line width W of an electrode finger, a space width S between adjacent electrode fingers, and an intersecting width L that is an overlapping length of the electrode fingers when viewed in the X direction. A wavelength λ that is a repetition period of electrode fingers of any one of a pair of comb-shaped electrodes, a pitch (W+S) that is a repetition period of electrode fingers of both the comb-shaped electrodes constituting the pair, and a duty ratio W/(W+S) that is a ratio of the line width W to the pitch, are also examples of the electrode parameters. Also, a number N of pairs, that is a number obtained by dividing the number of electrode fingers obtained by adding the electrode fingers of both the comb-shaped electrodes of the pair by 2, is also included in the electrode parameters.

According to the additional circuit 20 configured as described above, for example, when a high-frequency signal is supplied to the IDT electrode 211 via the terminal T1, a surface acoustic wave is excited by the IDT electrode 211, and a potential difference is generated in the IDT electrode 212. Since the respective one ends and the respective other ends of the IDT electrode 212 and the IDT electrode 222 are connected in common, a current flows through the IDT electrode 212 due to the potential difference generated in the IDT electrode 222. Accordingly, a surface acoustic wave is excited by the IDT electrode 222, a potential difference is generated in the IDT electrode 221, and a high-frequency signal is extracted through the terminal T2. In this way, a high-frequency signal is transmitted from the terminal T1 to the terminal T2. A high-frequency signal is similarly transmitted from the terminal T2 to the terminal T1 through a path reverse to the path described above.

That is, the IDT electrodes 211 and 221 define and function as IDT electrodes for signal input to and output from the IDT electrode groups 201 and 202, respectively, and the IDT electrodes 212 and 222 define and function as IDT electrodes for interstage connection.

When signals are transmitted by utilizing coupling of surface acoustic waves between the IDT electrodes 211 and 212 and between the IDT electrodes 221 and 222, the IDT electrode groups 201 and 202 are longitudinally coupled resonators. A longitudinally coupled resonator is often provided with a reflector, although the reflector is not required. In addition, when signals are transmitted by utilizing propagation of surface acoustic waves between the IDT electrodes 211 and 212 and between the IDT electrodes 221 and 222, the IDT electrode groups 201 and 202 are transversal filters. In a transversal filter, instead of the reflector, a sound absorbing material may be provided.

According to phase adjustment between the terminals T1 and T2, a cancellation signal to cancel a signal component (for example, in a reception band) of a cancellation target among signals transmitted by the transmission filter circuit 11 is generated. A cancellation signal is a signal for which, when combined with a signal component of a cancellation target, the amplitude of a signal component as a combination result is smaller than the amplitude of the signal component of the original cancellation target, and is a signal having an opposite phase and preferably the same or substantially the same amplitude to the signal component of the cancellation target after passing through the transmission filter circuit 11.

Here, "the signal component of the cancellation target and the cancellation signal have phases opposite to each other" means that an absolute value of a phase difference between the signal component and the cancellation signal is greater than about 90° in a range of about −180° or more and about 180° or less. In other words, this means that the signal component of the cancellation target and the cancellation signal have phase components opposite to each other.

Further, it is preferable that the cancellation signal be the same or substantially the same as the signal component of the cancellation target in amplitude, but may be different in amplitude. When, in accordance with the phase difference between the cancellation signal and the signal component of the cancellation target, the amplitude of the combination result of the cancellation signal and the signal component of the cancellation target is smaller than the amplitude of the signal component of the original cancellation target, it is possible to improve attenuation characteristics of the transmission filter 51.

According to the additional circuit 20, since the respective one ends and the respective other ends of the IDT electrodes 212 and the IDT electrodes 222 are connected in common, it is not necessary to connect the IDT electrodes 212 and 222 to the ground in order to transmit a high-frequency signal between the IDT electrodes 212 and 222. Further, the respective other ends of the IDT electrodes 211 and the IDT electrodes 221 are connected in common and are connected to the ground 26 at only one location. Thus, only one ground is required for the IDT electrode groups 201 and 202 defining the additional circuit 20.

This simplifies ground wiring, and thus, for example, it is possible to reduce or prevent an increase in area of the additional circuit due to the ground wiring, as compared to an additional circuit including an IDT electrode group in one stage, and all of one ends of respective IDT electrodes are connected to the ground.

Further, since the respective one ends of the IDT electrodes 212 and 222 are connected in common by being connected to each other via the reflectors 218 and 228, an increase in area of the additional circuit 20 due to additional wiring does not occur.

Further, according to the above-described additional circuit, the IDT electrode groups 201 and 202 connected in multiple stages are used, and thus, a degree of freedom in phase adjustment between the terminals T1 and T2 is higher, as compared to an additional circuit constituted by an IDT electrode group in one stage, for example. Thus, it is possible to generate a cancellation signal with higher accuracy for a signal component of a cancellation target in a wider band, so as to obtain the transmission filter 51 (FIG. 1) having excellent attenuation characteristic.

As described above, by using the additional circuit 20, it is possible to obtain the transmission filter 51 that has excellent attenuation characteristics and enables size reduction. Further, by attenuating a signal component in a reception band by using the transmission filter 51, it is possible to obtain the duplexer 1 that has excellent isolation characteristics during transmission and reception and enables size reduction.

Next, advantageous effects of the duplexer 1 by the additional circuit 20 will be described in more detail based on comparison with Comparative Example. In the following description, the additional circuit 20 will be referred to as Example, and for example, an additional circuit including an IDT electrode group in one stage as disclosed in Japanese Unexamined Patent Application Publication No. 2013-118611 will be referred to as Comparative Example.

Figure 5:
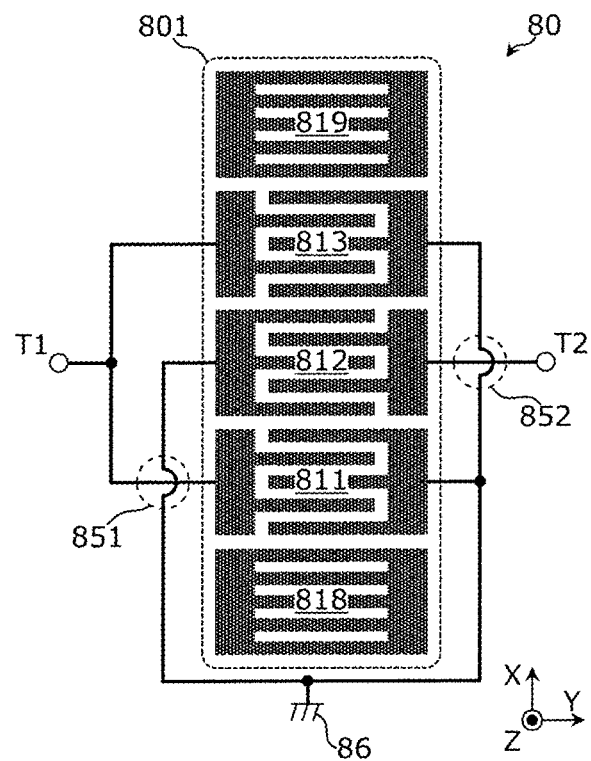
FIG. 5 is a plan view schematically illustrating an example of the structure of an IDT electrode group according to a Comparative Example.

FIG. 5 is a plan view schematically illustrating an example of the structure of an IDT electrode group according to Comparative Example. An IDT electrode group 801 in FIG. 5 includes IDT electrodes 811, 812, and 813, and reflectors 818 and 819. In the IDT electrode group 801, an acoustic wave propagates in the X direction.

The IDT electrodes 811, 812, and 813 are side by side in the X direction. The reflectors 818 and 819 are disposed adjacent to the IDT electrodes 811 and 813 in the X direction, respectively.

One end (a busbar electrode on a left side in the figure) of each of the IDT electrodes 811 and 813 is connected to the terminal T1, and the other end (a busbar electrode on a right side in the figure) is connected to the ground. One end of the IDT electrode 812 (a busbar electrode on the right side in the figure) is connected to the terminal T2, and the other end (a busbar electrode on the left side in the figure) is connected to the ground.

An additional circuit 80 including the IDT electrode group 801 generates a cancellation signal in accordance with phase adjustment between the terminals T1 and T2, similarly to the additional circuit 20 using the IDT electrode groups 201 and 202.

However, in the IDT electrode group 801, when connection to a ground 86 is attempted at only one place, ground wiring is required to connect the other end of each of the IDT electrodes 811, 812, and 813 to the ground 86, and there is a problem in that an area of the additional circuit 80 is increased. Further, three dimensional wiring lines 851 and 852 crossing the ground wiring and signal wiring are required, and there is a problem in that a phase adjustment function is deteriorated due to an increase in parasitic capacitance due to a complicated wiring structure.

These problems become worse when, for example, an IDT electrode group is provided in two stages, in order to improve attenuation characteristics of a filter and isolation characteristics of a multiplexer.

By simulation, isolation characteristics during transmission and reception of the duplexer 1 in FIG. 1 are obtained in a case where the additional circuit 20 is used, and in a case where the additional circuit 80 is used, instead of the additional circuit 20. Table 1 illustrates electrode parameters of the IDT electrode group 201 (first stage) and the IDT electrode group 202 (second stage) used in the simulation.

TABLE 1

| | CONSTITUENT ELEMENT | REFERENCE SIGN | WAVELENGTH $\lambda$ [μm] | DUTY RATIO $W/(S + W)$ | INTERSECTING WIDTH L [μm] | NUMBER N OF PAIRS |
|---|---|---|---|---|---|---|
| FIRST STAGE | REFLECTOR | 218, 219 | 1.973 | 0.6 | 20.9 | 2 |
| | IDT ELECTRODE | 211 | 1.941 | | | 2 |
| | IDT ELECTRODE | 212 | 1.972 | | | 8 |
| SECOND STAGE | REFLECTOR | 228, 229 | 2.039 | 0.6 | 22.8 | 10 |
| | IDT ELECTRODE | 221 | 2.038 | | | 2 |
| | IDT ELECTRODE | 222 | 2.015 | | | 3 |

Figure 6:
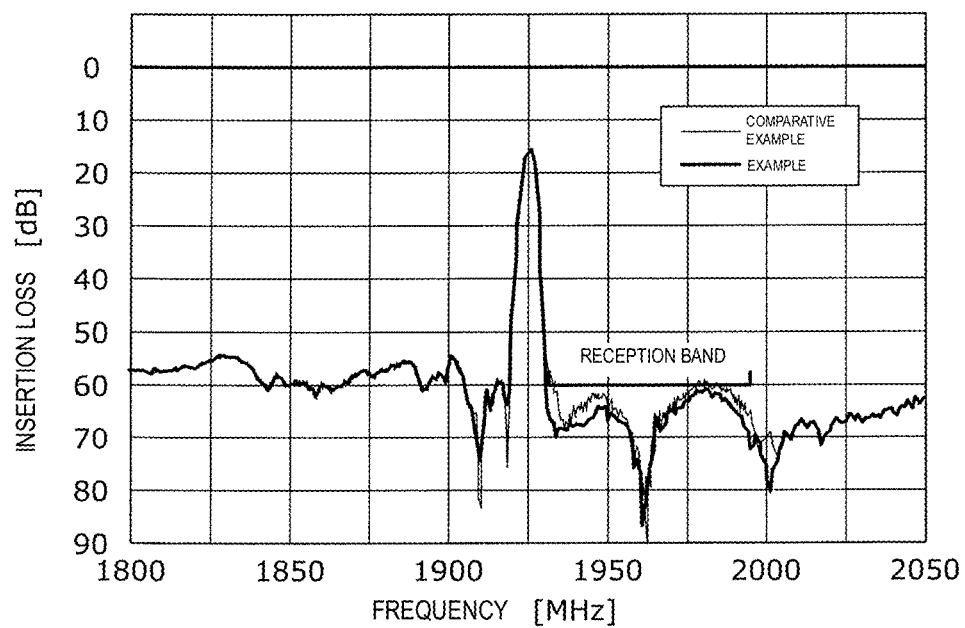
FIG. 6 is a graph showing an example of isolation characteristics during transmission and reception of the duplexer according to Preferred Embodiment 1 of the present invention.

FIG. 6 is a graph showing an example of isolation characteristics between the terminals Tx-Rx of the duplexer 1.

In FIG. 6, Example shows isolation characteristics when the additional circuit 20 in FIG. 3 was used. Respective shapes and sizes of the IDT electrode groups 201 and 202 were set in accordance with the electrode parameters in Table 1. Comparative Example shows isolation characteristics in a case where the additional circuit 80 in FIG. 5 was used, instead of the additional circuit 20.

In FIG. 6, in order to increase attenuation in a reception band of the transmission filter 51, a signal component in the reception band (for example, about 1930 MHz or more and about 1995 MHz or less) was set as a cancellation target in the transmission filter 51.

As seen in FIG. 6, in Example, isolation in the reception band was improved by about 2 dB, compared to Comparative Example. This is because, in the additional circuit 20, since wiring structure is simpler compared to the additional circuit 80, unnecessary parasitic capacitance is reduced, and as a result, an improved phase adjustment function is provided.

In this way, by using the additional circuit 20, it was confirmed that the duplexer 1 having excellent isolation can be obtained while reducing or preventing an increase in area of the additional circuit 20 due to ground wiring.

Next, a modified example of the IDT electrode group used in the additional circuit will be described.

Figure 7:
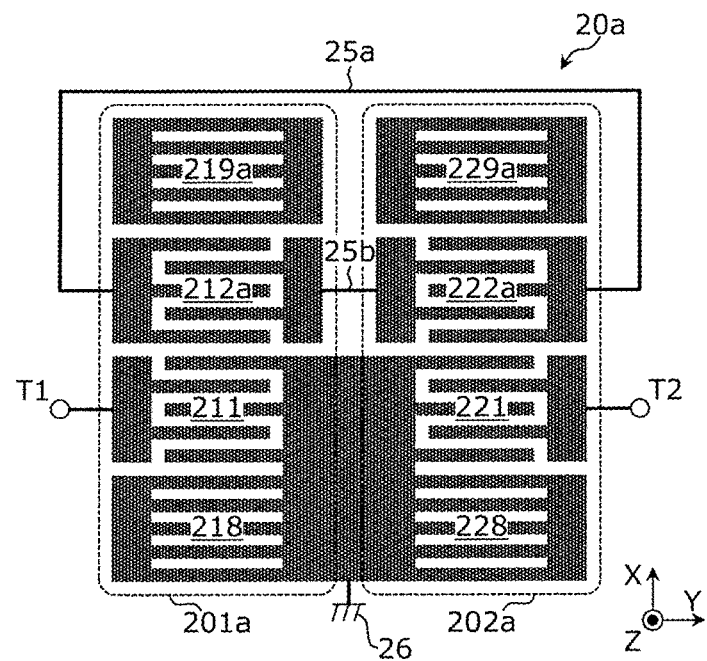
FIG. 7 is a plan view schematically illustrating an example of structure of an IDT electrode group according to a modified example of Preferred Embodiment 1 of the present invention.

FIG. 7 is a plan view schematically illustrating an example of the structure of an IDT electrode group according to a modified example of Preferred Embodiment 1. IDT electrode groups 201a and 202a illustrated in FIG. 7 are different from the IDT electrode groups 201 and 202 in FIG. 3 in that respective one ends of the IDT electrodes 212a and 222a are connected in common by being connected to each other by wiring line 25a, and the respective other ends of the IDT electrodes 212a and 222a are connected in common by being connected to each other by wiring line 25b, and that reflectors 219a and 229a are not connected to each other.

According to an additional circuit 20a including the IDT electrode groups 201a and 202a, for example, it is possible to simplify wiring because three dimensional wiring is not required, as compared with the additional circuit 80 illustrated in FIG. 5.

Figure 8:
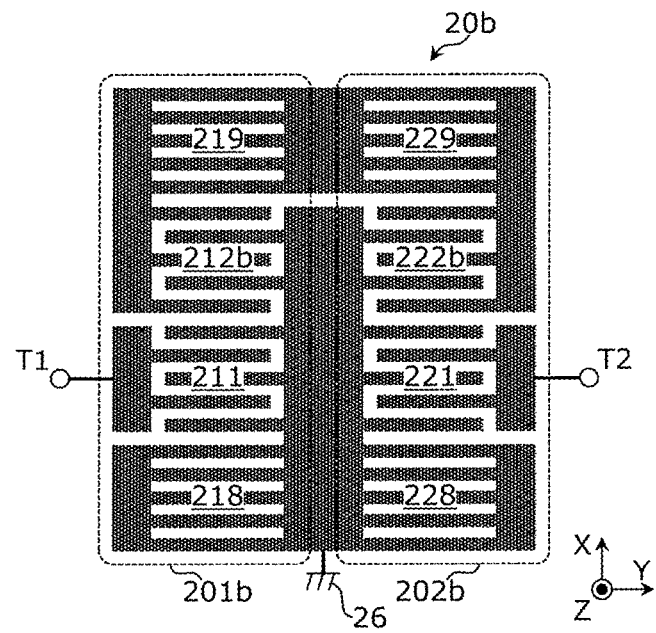
FIG. 8 is a plan view schematically illustrating an example of structure of an IDT electrode group according to another modified example of Preferred Embodiment 1 of the present invention.

FIG. 8 is a plan view schematically illustrating an example of structure of an IDT electrode group according to another modified example of Preferred Embodiment 1. IDT electrode groups 201b and 202b illustrated in FIG. 8 are different from the IDT electrode groups 201 and 202 illustrated in FIG. 3 in that the other end of an IDT electrode 212b and the other end of an IDT electrode 222b are further connected in common with the other end of the IDT electrode 211 and the other end of the IDT electrode 221, respectively, and are connected to the ground 26.

According to an additional circuit 20b using the IDT electrode groups 201b and 202b, the other end of the IDT electrode 212b and the other end of the IDT electrode 222b are connected to the ground 26, thus ground potential of the IDT electrodes 212b and 222b is stabilized, and attenuation of a high-frequency signal between stages is suppressed. Since the respective other ends of the IDT electrodes 211, 212b, 221, and 222b are connected in common by being constituted by a single electrode, the above-described effects can be obtained without increasing an area of the additional circuit by additional ground wiring.

Figure 9:
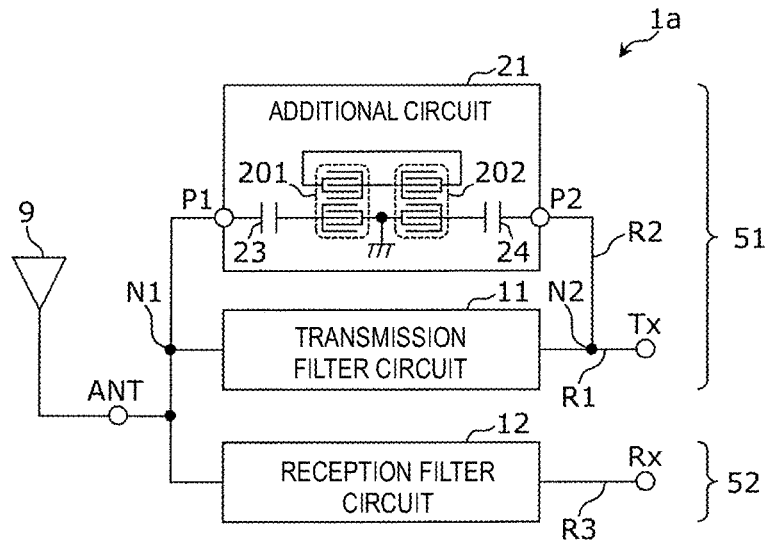
FIG. 9 is a circuit diagram illustrating an example of a configuration of a duplexer according to a modified example of Preferred Embodiment 1 of the present invention.

FIG. 9 is a circuit diagram illustrating an example of a configuration of a duplexer including an additional circuit according to a modified example of Preferred Embodiment 1. An additional circuit 21 included in a duplexer 1a illustrated in FIG. 9 is different from the additional circuit 20 illustrated in FIG. 1 in that a capacitive element 24 is included.

With the duplexer 1a including the additional circuit 21, it is also possible to obtain a duplexer that has good isolation characteristics and enables size reduction, similarly to the duplexer 1.

Figure 10:
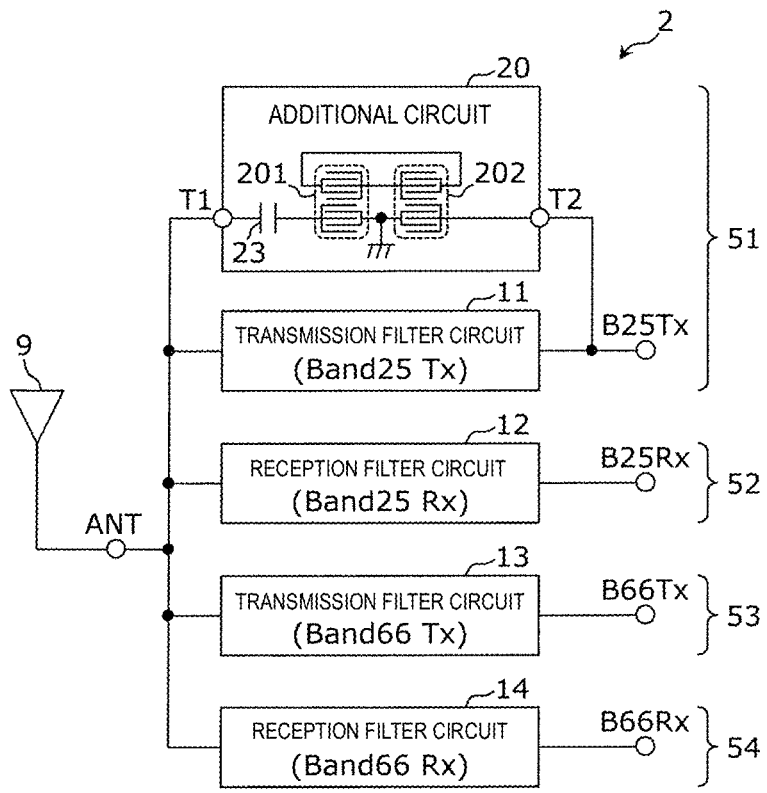
FIG. 10 is a circuit diagram illustrating an example of a configuration of a quadplexer according to a modified example of Preferred Embodiment 1 of the present invention.

FIG. 10 is a circuit diagram illustrating an example of a configuration of a multiplexer according to a modified example of Preferred Embodiment 1. A quadplexer 2 illustrated in FIG. 10 is configured by adding a transmission filter 53 and a reception filter 54 to the duplexer 1 in FIG. 1. The transmission filter 53 and the reception filter 54 are defined by a transmission filter circuit 13 and a reception filter circuit 14, respectively. Each of the transmission filter circuit 13 and the reception filter circuit 14 may be, for example, an acoustic wave filter circuit including a plurality of acoustic wave resonators.

Respective pass bands of the transmission filter 51 and the reception filter 52 may preferably be, for example, an uplink frequency band (about 1850 MHz or more and about 1915 MHz or less) and a downlink frequency band (about 1930 MHz or more and about 1995 MHz or less), respectively, of Band 25 in Long Term Evolution (LTE) that is a communication standard of a mobile phone.

Respective pass bands of the transmission filter 53 and the reception filter 54 may preferably be, for example, an uplink frequency band (about 1710 MHz or more and about 1780 MHz or less) and a downlink frequency band (about 2110 MHz or more and about 2200 MHz or less), respectively, of Band 66 in LTE.

As described above, not only in the duplexers 1 and 1a, but also in the duplexer 2, a quadplexer that has good isolation characteristics and enables size reduction can be obtained by using the additional circuit 20.

Preferred Embodiment 2

In Preferred Embodiment 2 of the present invention, an additional circuit in which a phase adjustment function is improved will be described.

Figure 11:
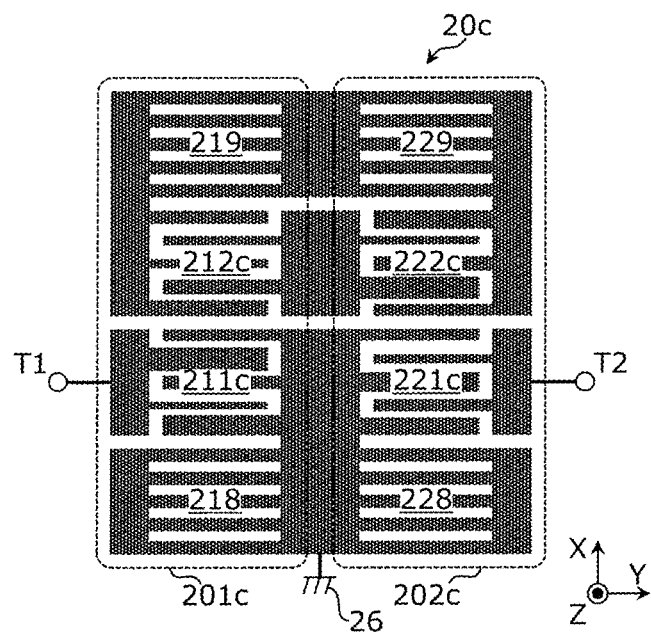
FIG. 11 is a plan view schematically illustrating an example of structure of an IDT electrode group according to Preferred Embodiment 2 of the present invention.

FIG. 11 is a plan view schematically illustrating an example of the structure of IDT electrode groups 201c and 202c included in an additional circuit 20c according to Preferred Embodiment 2. The IDT electrode groups 201c and 202c illustrated in FIG. 11 are different from the IDT electrode groups 201 and 202 in FIG. 3 in that a duty ratio of each of the IDT electrodes 211c, 212c, 221c, and 222c is independently set for each electrode finger.

By providing the plurality of electrode fingers having the different duty ratios, it is possible to finely adjust a phase of the additional circuit 20c for each frequency. Accordingly, the additional circuit 20c can generate a cancellation signal with higher accuracy, and thus, attenuation characteristics of the transmission filter 51 can be further improved. The transmission filter 51 having the improved attenuation characteristics can be used to obtain a multiplexer in which isolation characteristics are greatly improved.

Figure 12:
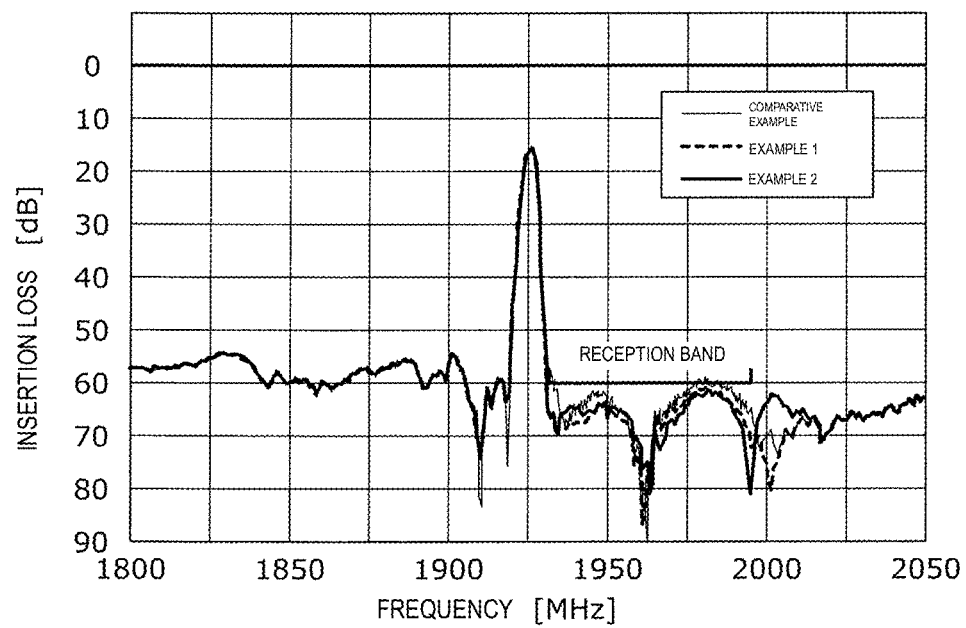
FIG. 12 is a graph showing an example of isolation characteristics during transmission and reception of a duplexer according to Preferred Embodiment 2 of the present invention.

FIG. 12 is a graph showing an example of isolation characteristics between the terminals Tx-Rx of the duplexer 1. In FIG. 12, Example 1 shows isolation characteristics (the same as in Example in FIG. 6) when the additional circuit 20 in FIG. 3 is used, and Example 2 shows isolation characteristics when the additional circuit 20c in FIG. 11 is used, instead of the additional circuit 20. In addition, for comparison, isolation characteristics (the same as in Comparative Example in FIG. 6) when the additional circuit 80 in FIG. 5 is used are shown.

As shown in FIG. 12, in Example 2, isolation in a reception band is improved by about 0.5 dB compared to that in Example 1.

Note that, it is not necessary to independently set a duty ratio for each electrode finger in all of the IDT electrodes 211c, 212c, 221c, and 222c, in order to improve the isolation characteristics. For example, it is sufficient that in at least one of the IDT electrodes 211c, 212c, 221c, and 222c, duty ratios of some electrode fingers are set to be different from duty ratios of other electrode fingers. Accordingly, when adjustment is performed such that a signal component in a reception band passing through the transmission filter circuit 11 is attenuated, the isolation characteristics can be improved.

Figure 13:
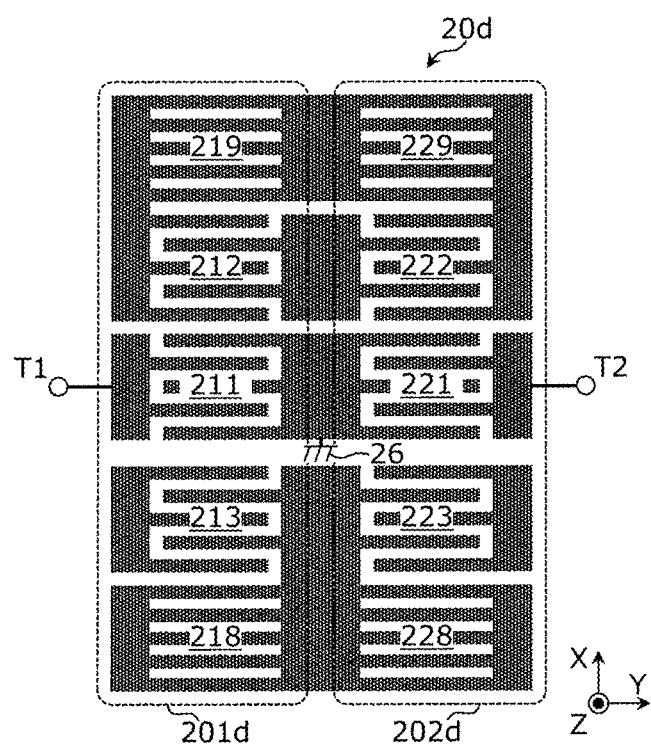
FIG. 13 is a plan view schematically illustrating an example of structure of an IDT electrode group according to a modified example of Preferred Embodiment 2 of the present invention.

FIG. 13 is a plan view schematically illustrating an example of the structure of IDT electrode groups 201d and 202d used in an additional circuit 20d according to a modified example of Preferred Embodiment 2. The IDT electrode groups 201d and 202d illustrated in FIG. 13 include IDT electrodes 213 and 223 in addition to the IDT electrode groups 201 and 202 used in the additional circuit 20 in FIG. 3, respectively.

According to the IDT electrode groups 201d and 202d, in addition to the IDT electrodes 212 and 222, the IDT electrodes 213 and 223 define and function as IDT electrodes providing interstage connection. That is, high-frequency signals are transmitted between the IDT electrode groups

201*d* and 202*d* via, in addition to a path through the IDT electrodes 212, 219, 229, and 222, a path through the IDT electrodes 213, 218, 228, and 223.

In the additional circuit 20*d*, a degree of freedom in phase adjustment is higher compared to the additional circuit 20, since the number of transmission paths of high-frequency signals between the stages is two. Thus, it is possible to generate a cancellation signal with higher accuracy for a signal component in a wider frequency band.

Although the filter and the multiplexer according to preferred embodiments of the present invention have been described above, the present invention is not limited to the individual preferred embodiments. Various modifications that can be conceived by those skilled in the art without departing from the spirit of the present invention may be made to the preferred embodiments, and configurations that are provided by combining elements in different preferred embodiments may also be included within the scope of one or more aspects of the present invention.

A filter according to a preferred embodiment of the present invention includes a filter circuit, and an additional circuit connected in parallel with at least a portion of the filter circuit, wherein the additional circuit includes a first IDT electrode group and a second IDT electrode group connected in multiple stages between a first input/output terminal and a second input/output terminal, the first IDT electrode group includes a first IDT electrode and a second IDT electrode that are side by side in a propagation direction of an acoustic wave, the second IDT electrode group includes a third IDT electrode and a fourth IDT electrode that are side by side in a propagation direction of an acoustic wave, one end of the first IDT electrode is connected to the first input/output terminal, one end of the third IDT electrode is connected to the second input/output terminal, the other end of the first IDT electrode and the other end of the third IDT electrode are connected in common and connected to a ground, one end of the second IDT electrode and one end of the fourth IDT electrode are connected in common, and the other end of the second IDT electrode and the other end of the fourth IDT electrode are connected in common.

In such a configuration, for example, when a high-frequency signal is supplied to the first IDT electrode, an acoustic wave is excited by the first IDT electrode, and a potential difference is generated in the second IDT electrode. Since the respective one ends and the respective other ends of the second IDT electrode and the fourth IDT electrode are connected in common, an electric current flows through the fourth IDT electrode due to the potential difference generated in the second IDT electrode. Accordingly, a surface acoustic wave is excited by the fourth IDT electrode, and a potential difference is generated in the third IDT electrode. In this way, the high-frequency signal is transmitted from the first IDT electrode to the third IDT electrode. A high-frequency signal is transmitted from the third IDT electrode to the first IDT electrode in the same or similar manner through a path reverse to the path described above.

That is, the first IDT electrode and the third IDT electrode define and function as IDT electrodes providing signal input to and output from the first IDT electrode group and the second IDT electrode group, respectively, and the second IDT electrode and the fourth IDT electrode define and function as IDT electrodes providing interstage connection.

By adjusting an amount of phase rotation between the first IDT electrode and the third IDT electrode, it is possible to generate a cancellation signal having a phase opposite to that of a signal component in a stopband passing through the filter circuit. By combining the generated cancellation signal and the signal passing through the filter circuit, attenuation characteristics of the filter are improved.

According to the above-described additional circuit, since the respective one ends and the respective other ends of the second IDT electrode and the fourth IDT electrode are connected in common, it is not necessary to connect the second IDT electrode and the fourth IDT electrode to the ground in order to transmit a high-frequency signal. In addition, the respective other ends of the first IDT electrode and the second IDT electrode are connected in common, and are connected to the ground only at one location. Thus, only one ground is required for the IDT electrode group of the additional circuit.

This simplifies ground wiring, and thus, for example, it is possible to reduce or prevent an increase in area of the additional circuit due to the ground wiring, as compared to an additional circuit includes an IDT electrode group in one stage, and all of one ends of respective IDT electrodes are connected to the ground.

Further, according to the above-described additional circuit, the two IDT electrode groups connected in multiple stages are provided, and thus, a degree of freedom in phase adjustment is improved, as compared to an additional circuit constituted by an IDT electrode group in one stage, for example. Thus, it is possible to generate a cancellation signal with higher accuracy for a signal component in a wider stopband, so as to obtain a filter having excellent attenuation characteristics.

In this way, by using the above-described additional circuit, it is possible to obtain a filter that has excellent attenuation characteristics and enables size reduction.

Also, neither the second IDT electrode nor the fourth IDT electrode may be connected to the ground.

According to this configuration, since the second IDT electrode and the fourth IDT electrode can be defined by independent electrodes that are not connected to the ground, ground wiring can be reduced and an area of the additional circuit can be reduced. Accordingly, a filter having excellent attenuation characteristics and enabling size reduction can be obtained.

Further, the other end of the first IDT electrode and the other end of the third IDT electrode may face each other, the other end of the second IDT electrode and the other end of the fourth IDT electrode may face each other, and the other end of the second IDT electrode and the other end of the fourth IDT electrode may be further connected in common with the other end of the first IDT electrode and the other end of the third IDT electrode and may be connected to the ground.

According to this configuration, in addition to the respective other ends of the first IDT electrode and the third IDT electrode, the respective other ends of the second IDT electrode and the fourth IDT electrode are all connected in common and are connected to the ground at only one location. By connecting the respective other ends of the second IDT electrode and the fourth IDT electrode to the ground, ground potential of the second IDT electrode and the fourth IDT electrode is stabilized, and attenuation of a high-frequency signal between stages is reduced or prevented. This advantageous effect can be obtained without an increase in area of the additional circuit due to ground wiring.

In addition, in at least one of the first IDT electrode, the second IDT electrode, the third IDT electrode, and the fourth IDT electrode, duty ratios of at least some electrode fingers may be different from duty ratios of other electrode fingers.

According to this configuration, by providing the plurality of electrode fingers having the different duty ratios, it is possible to finely set an amount of the phase adjustment of the additional circuit for each frequency. Accordingly, it is possible to generate a cancellation signal with higher accuracy, and thus it is possible to obtain a filter having excellent attenuation characteristics.

Further, the first IDT electrode group may define a first longitudinally coupled resonator, and the second IDT electrode group may define a second longitudinally coupled resonator.

Further, the first longitudinally coupled resonator may include a first reflector disposed adjacent to the second IDT electrode in a propagation direction of an acoustic wave, the second longitudinally coupled resonator may include a second reflector disposed adjacent to the fourth IDT electrode in a propagation direction of an acoustic wave, and the one end of the second IDT electrode and the one end of the fourth IDT electrode may be connected in common via the first reflector and the second reflector.

According to this configuration, since the respective one ends of the second IDT electrodes and the fourth IDT electrodes are connected in common by being connected to each other via the first reflector and the second reflector, it is possible to obtain a filter that enables size reduction, in which the area of the additional circuit does not increase due to additional wiring.

In addition, the filter circuit may be an acoustic wave filter circuit including a plurality of acoustic wave resonators.

According to this configuration, since both of the filter circuit and the additional circuit are defined by the acoustic wave resonators, all of the resonators of the filter are provided on a single piezoelectric substrate, and thus it is possible to reduce the size of the filter.

A multiplexer according to a preferred embodiment of the present invention includes a plurality of filters one ends of which are connected to each other, in which at least one of the plurality of filters is the filter described above.

According to this configuration, it is possible to obtain a multiplexer having excellent isolation and enabling size reduction, by including the filter that has excellent attenuation characteristics and enables size reduction.

Preferred embodiments of the present invention are widely applicable to communication devices such as a mobile phone, for example, as a filter and a multiplexer including an additional circuit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter, comprising:
   a filter circuit; and
   an additional circuit connected in parallel with at least a portion of the filter circuit; wherein
   the additional circuit includes a first IDT electrode group and a second IDT electrode group connected in multiple stages between a first input/output terminal and a second input/output terminal;
   the first IDT electrode group includes a first interdigital transducer (IDT) electrode and a second IDT electrode that are side by side in a propagation direction of an acoustic wave;
   the second IDT electrode group includes a third IDT electrode and a fourth IDT electrode that are side by side in the propagation direction of the acoustic wave;
   a first end of the first IDT electrode is connected to the first input/output terminal;
   a first end of the third IDT electrode is connected to the second input/output terminal;
   a second end of the first IDT electrode and a second end of the third IDT electrode are connected in common and connected to a ground;
   a first end of the second IDT electrode and a first end of the fourth IDT electrode are connected in common;
   a second end of the second IDT electrode and a second end of the fourth IDT electrode are connected in common; and
   at least a portion of the filter circuit is provided outside of a portion between the connection of the first end of the first IDT electrode to the first input/output terminal.

2. The filter according to claim 1, wherein neither the second IDT electrode nor the fourth IDT electrode is connected to the ground.

3. The filter according to claim 1, wherein
   the second end of the first IDT electrode and the second end of the third IDT electrode face each other;
   the second end of the second IDT electrode and the second end of the fourth IDT electrode face each other; and
   the second end of the second IDT electrode and the second end of the fourth IDT electrode are connected in common with the second end of the first IDT electrode and the second end of the third IDT electrode and are connected to the ground.

4. The filter according to claim 1, wherein, in at least one of the first IDT electrode, the second IDT electrode, the third IDT electrode, and the fourth IDT electrode, a duty ratios of at least one electrode fingers is different from duty ratios of other electrode fingers.

5. The filter according to claim 1, wherein
   the first IDT electrode group defines a first longitudinally coupled resonator; and
   the second IDT electrode group defines a second longitudinally coupled resonator.

6. The filter according to claim 5, wherein
   the first longitudinally coupled resonator includes a first reflector disposed adjacent to the second IDT electrode in the propagation direction of the acoustic wave;
   the second longitudinally coupled resonator includes a second reflector disposed adjacent to the fourth IDT electrode in the propagation direction of the acoustic wave; and
   the first end of the second IDT electrode and the first end of the fourth IDT electrode are connected in common via the first reflector and the second reflector.

7. The filter according to claim 1, wherein the filter circuit is an acoustic wave filter circuit including a plurality of acoustic wave resonators.

8. A multiplexer, comprising:
   a plurality of filters; wherein
   first ends of the plurality of filters are connected to each other; and
   at least one of the plurality of filters is the filter according to claim 1.

9. The multiplexer according to claim 8, wherein neither the second IDT electrode nor the fourth IDT electrode is connected to the ground.

10. The multiplexer according to claim 8, wherein
the second end of the first IDT electrode and the second end of the third IDT electrode face each other;
the second end of the second IDT electrode and the second end of the fourth IDT electrode face each other; and
the second end of the second IDT electrode and the second end of the fourth IDT electrode are connected in common with the second end of the first IDT electrode and the second end of the third IDT electrode and are connected to the ground.

11. The multiplexer according to claim 8, wherein, in at least one of the first IDT electrode, the second IDT electrode, the third IDT electrode, and the fourth IDT electrode, a duty ratios of at least one electrode fingers is different from duty ratios of other electrode fingers.

12. The multiplexer according to claim 8, wherein
the first IDT electrode group defines a first longitudinally coupled resonator; and
the second IDT electrode group defines a second longitudinally coupled resonator.

13. The multiplexer according to claim 12, wherein
the first longitudinally coupled resonator includes a first reflector disposed adjacent to the second IDT electrode in the propagation direction of the acoustic wave;
the second longitudinally coupled resonator includes a second reflector disposed adjacent to the fourth IDT electrode in the propagation direction of the acoustic wave; and
the first end of the second IDT electrode and the first end of the fourth IDT electrode are connected in common via the first reflector and the second reflector.

14. The multiplexer according to claim 8, wherein the filter circuit is an acoustic wave filter circuit including a plurality of acoustic wave resonators.

15. The filter according to claim 1, wherein the filter circuit is a transmission filter circuit.

16. The filter according to claim 15, wherein the transmission filter includes:
a ladder filter including at least one series resonator and at least one parallel resonator; and
at least one matching inductance element.

17. The filter according to claim 1, wherein the filter circuit is a reception filter circuit.

18. The filter according to claim 17, wherein the reception filter includes:
a ladder filter including at least one series resonator and at least one parallel resonator; and
a longitudinally coupled resonator-Lc including a plurality of resonators.

19. A filter, comprising:
a filter circuit; and
an additional circuit connected in parallel with at least a portion of the filter circuit; wherein
the additional circuit includes a first IDT electrode group and a second IDT electrode group connected in multiple stages between a first input/output terminal and a second input/output terminal;
the first IDT electrode group includes a first interdigital transducer (IDT) electrode and a second IDT electrode that are side by side in a propagation direction of an acoustic wave;
the second IDT electrode group includes a third IDT electrode and a fourth IDT electrode that are side by side in the propagation direction of the acoustic wave;
a first end of the first IDT electrode is connected to the first input/output terminal;
a first end of the third IDT electrode is connected to the second input/output terminal;
a second end of the first IDT electrode and a second end of the third IDT electrode are connected in common and connected to a ground;
a first end of the second IDT electrode and a first end of the fourth IDT electrode are connected in common;
a second end of the second IDT electrode and a second end of the fourth IDT electrode are connected in common; and
in a direction extending from the first input/output terminal to the second input/output terminal, the first input/output terminal is connected to the first end of the first IDT electrode at a portion of the additional circuit that is closer to the first input/output terminal than to the second input/output terminal.

20. A filter, comprising:
a filter circuit; and
an additional circuit connected in parallel with at least a portion of the filter circuit; wherein
the additional circuit includes a first IDT electrode group and a second IDT electrode group connected in multiple stages between a first input/output terminal and a second input/output terminal;
the first IDT electrode group includes a first interdigital transducer (IDT) electrode and a second IDT electrode that are side by side in a propagation direction of an acoustic wave;
the second IDT electrode group includes a third IDT electrode and a fourth IDT electrode that are side by side in the propagation direction of the acoustic wave;
a first end of the first IDT electrode is connected to the first input/output terminal;
a first end of the third IDT electrode is connected to the second input/output terminal;
a second end of the first IDT electrode and a second end of the third IDT electrode are connected in common and connected to a ground;
a first end of the second IDT electrode and a first end of the fourth IDT electrode are connected in common separately from the first and second input/output terminals; and
a second end of the second IDT electrode and a second end of the fourth IDT electrode are connected in common separately from the first and second input/output terminals.

* * * * *